US011450514B1

(12) United States Patent
Dou et al.

(10) Patent No.: US 11,450,514 B1
(45) Date of Patent: Sep. 20, 2022

(54) METHODS OF REDUCING PARTICLES IN A PHYSICAL VAPOR DEPOSITION (PVD) CHAMBER

(71) Applicant: Applied Materials, Inc., Santa Clara, CA (US)

(72) Inventors: Wei Dou, Sunnyvale, CA (US); Yong Cao, San Jose, CA (US); Mingdong Li, Santa Clara, CA (US); Shane Lavan, Santa Clara, CA (US); Jothilingam Ramalingam, Milpitas, CA (US); Chengyu Liu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/203,786

(22) Filed: Mar. 17, 2021

(51) Int. Cl.
*C23C 14/14* (2006.01)
*H01J 37/32* (2006.01)
*C23C 14/34* (2006.01)
*C23C 14/54* (2006.01)
*C23C 14/06* (2006.01)

(52) U.S. Cl.
CPC .... *H01J 37/32504* (2013.01); *C23C 14/0652* (2013.01); *C23C 14/14* (2013.01); *C23C 14/34* (2013.01); *C23C 14/54* (2013.01); *H01J 2237/332* (2013.01)

(58) Field of Classification Search
None
See application file for complete search history.

(56) References Cited

U.S. PATENT DOCUMENTS

| 5,380,414 | A | * | 1/1995 | Tepman | C23C 14/34 |
| | | | | | 204/192.12 |
| 5,707,498 | A | * | 1/1998 | Ngan | H01J 37/321 |
| | | | | | 204/192.12 |
| 6,589,398 | B1 | * | 7/2003 | Lu | C23C 14/564 |
| | | | | | 204/192.18 |
| 9,773,665 | B1 | * | 9/2017 | Zeng | C23C 14/0652 |
| 2006/0292310 | A1 | | 12/2006 | Le et al. | |
| 2010/0086805 | A1 | | 4/2010 | Lin et al. | |
| 2016/0168687 | A1 | | 6/2016 | Ramalingam et al. | |
| 2018/0108517 | A1 | | 4/2018 | Sun et al. | |
| 2020/0020807 | A1 | | 1/2020 | Lai et al. | |
| 2020/0176225 | A1 | | 6/2020 | Marchand | |

OTHER PUBLICATIONS

PCT International Search Report and Written Opinion for PCT/US2022/020412 dated Jun. 30, 2022.

* cited by examiner

*Primary Examiner* — Jason Berman
(74) *Attorney, Agent, or Firm* — Moser Taboada

(57) ABSTRACT

Embodiments of methods and apparatus for reducing particle formation in physical vapor deposition (PVD) chambers are provided herein. In some embodiments, a method of reducing particle formation in a PVD chamber includes: performing a plurality of first deposition processes on a corresponding series of substrates disposed on a substrate support in the PVD chamber, wherein the PVD chamber includes a cover ring disposed about the substrate support and having a texturized outer surface, and wherein a silicon nitride (SiN) layer having a first thickness is deposited onto the texturized outer surface during each of the plurality of first deposition processes; and performing a second deposition process on the cover ring between subsets of the plurality of first deposition processes to deposit an amorphous silicon layer having a second thickness onto an underlying silicon nitride (SiN) layer.

20 Claims, 4 Drawing Sheets

METHODS OF REDUCING PARTICLES IN A PHYSICAL VAPOR DEPOSITION (PVD) CHAMBER

FIELD

Embodiments of the present disclosure generally relate to substrate processing equipment and, more specifically, to reducing particle formation irk substrate processing equipment.

BACKGROUND

Sputtering, also known as physical vapor deposition (PVD), is a method of forming features in integrated circuits. Sputtering deposits a layer of material onto a substrate. A source material, such as a target, is bombarded by ions to eject material form the target. The material then deposits on the substrate. The inventors have observed that during the deposition process, material or contaminants can deposit onto chamber components. The material deposited onto the chamber components may form a series of deposit layers during each successive deposition process. The deposit layers may be prone to flaking, especially when the PVD chamber undergoes thermal cycling during and between processes, which generates unwanted particles and contaminants within the PVD chamber.

Therefore, the inventors have provided improved PVD processing chambers and methods of use to reduce unwanted particles therein.

SUMMARY

Embodiments of methods and apparatus for reducing particle formation in physical vapor deposition (PVD) chambers are provided herein. In some embodiments, a method of reducing particle formation in a PVD chamber includes: performing a plurality of first deposition processes on a corresponding series of substrates disposed on a substrate support in the PVD chamber, wherein the PVD chamber includes a process kit disposed about the substrate support and having a texturized outer surface, and wherein a silicon nitride (SiN) layer having a first thickness is deposited onto the texturized outer surface during each of the plurality of first deposition processes; and performing a second deposition process on the process kit between subsets of the plurality of first deposition processes to deposit an amorphous silicon layer having a second thickness onto an underlying silicon nitride (SiN) layer.

In some embodiments, a method of reducing particle formation in a physical vapor deposition (PVD) chamber, includes: performing a plurality of first deposition processes on a corresponding series of substrates disposed on a substrate support in the PVD chamber, wherein the PVD chamber includes a cover ring disposed about the substrate support and having a texturized outer surface, and wherein a silicon nitride (SiN) layer having a first thickness is deposited onto the texturized outer surface during each of the plurality of first deposition processes; performing a second deposition process on the cover ring between subsets of the plurality of first deposition processes to deposit an amorphous silicon layer having a second thickness onto an underlying silicon nitride (SiN) layer, wherein the second thickness is greater than the first thickness; and performing a third deposition process on the cover ring between a second subset of the plurality of first deposition processes to deposit an amorphous silicon layer having a third thickness greater than the second thickness.

In some embodiments, a method of reducing particle formation in a physical vapor deposition (PVD) chamber, includes: performing a first deposition process on a substrate disposed on a substrate support in the PVD chamber, wherein the PVD chamber includes a cover ring disposed about the substrate support and having a texturized outer surface, and wherein a silicon nitride (SiN) layer having a first thickness is deposited onto the texturized outer surface during the first deposition process: repeating the first deposition process on about 10 to about 20 subsequent corresponding substrates in the PVD chamber; and performing a second deposition process on the cover ring in the PVD chamber to deposit an amorphous silicon layer having a second thickness onto an underlying silicon nitride (SiN) layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
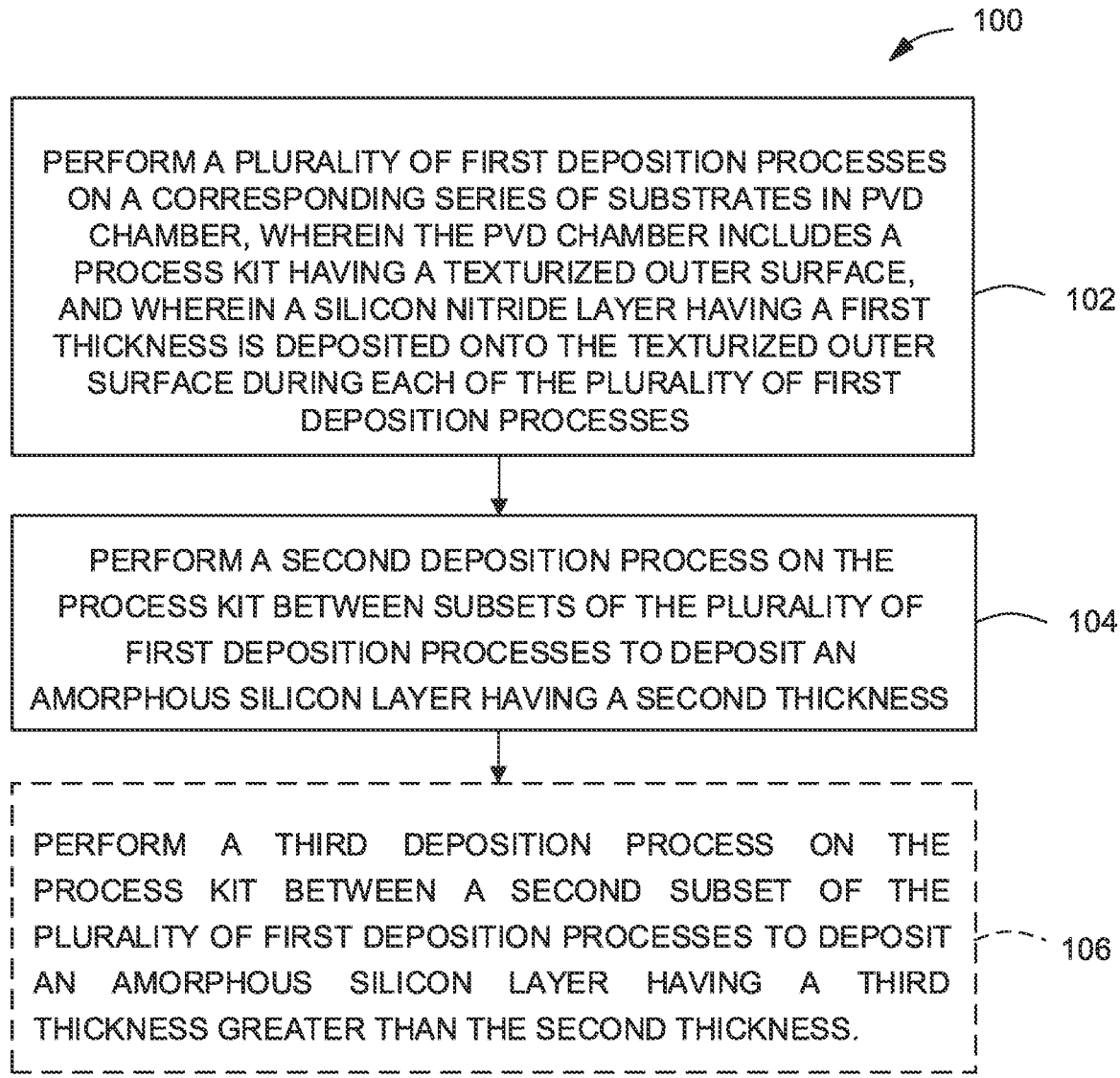
FIG. 1 depicts a flow chart of a method of reducing particle formation in a physical vapor deposition (PVD) chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for reducing particle formation in physical vapor deposition (PVD) chambers are provided herein. While performing deposition processes on a substrate disposed in the PVD chamber, material is deposited onto chamber components, such as process kits. The material deposited onto the chamber components may form a series of compressive layers during each successive deposition process. The compressive layers may be prone to flaking, especially when the PVD chamber undergoes thermal cycling. The methods provided herein facilitate adding a tensile layer of material over one or more compressive layers of material to prevent unwanted particle generation in the PVD chamber via, for example, flaking.

FIG. 1 depicts a flow chart of a method 100 of reducing particle formation in a physical vapor deposition (PVD) chamber in accordance with at least some embodiments of the present disclosure. At 102, the method 100 includes performing a plurality of first deposition processes in the PVD chamber, such as a process chamber 200 discussed below with respect to FIG. 2, on a corresponding series of substrates (e.g. substrates 204) disposed on a substrate support (e.g. substrate support 230) in the PVD chamber. The PVD chamber includes a process kit (e.g. process kit 250) disposed about the substrate support and having a texturized outer surface. The process kit may include one or more of a cover ring (e.g., cover ring 255), a deposition ring (e.g. deposition ring 254), a lower shield (e.g. lower shield 252), or upper shield (e.g., upper shield 251). The texturized outer surface may be texturized via any suitable method, for example, via bead blasting, arc spraying, additive manufacturing such as 3-D printing, or the like. In some embodiments, the texturized outer surface comprises a plurality of protrusions having a spacing therebetween of about 0.5 millimeters to about 4.5 millimeters. In some embodiments, the texturized outer surface comprises a plurality of protrusions having a height of about 0.2 millimeters to about 1.5 millimeters.

In some embodiments, the plurality of first deposition processes comprises using a process gas comprising nitrogen or a combination of nitrogen and argon and supplying the process gas via a gas supply (e.g. gas supply 266). During use, in some embodiments, a silicon nitride (SiN) layer having a first thickness is deposited onto the texturized outer surface of the process kit during each of the plurality of first deposition processes. In some embodiments, the first thickness is about 100 nanometers to about 300 nanometers. In some embodiments, the SiN layer is a compressive stress layer. For example, the SiN layer may have a compressive stress of about −2.0 GPa to about −1.0 GPa. During the plurality of first deposition processes, a plurality of the SiN layers are deposited onto the process kit. Between successive first deposition processes, the process chamber 200 may undergo thermal cycling, causing the plurality of SiN layers to crack and flake.

Figure 4:
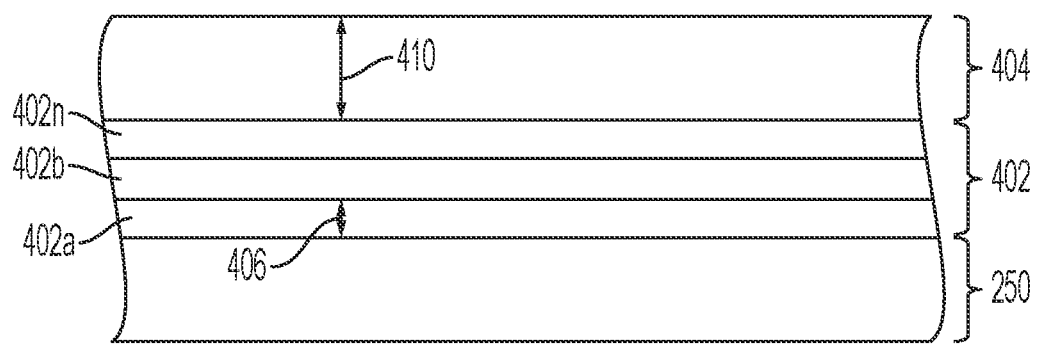
FIG. 4 depicts a schematic side view of a portion of a process kit in accordance with some embodiments of the present disclosure.

At 104, the method 100 includes performing a second deposition process on the process kit between subsets of the plurality of first deposition processes. In some embodiments, as shown in FIG. 4, an amorphous silicon layer (e.g., amorphous silicon layer 404) having a second thickness is deposited onto an underlying silicon nitride (SiN) layer (e.g., silicon nitride layer 402). The amorphous silicon layer advantageously covers and can counter the compressive stress of the SiN layers, therefore reducing or mitigating cracks and flaking of the SiN which can contaminate the process chamber. In some embodiments, the amorphous silicon layer is a tensile stress layer. In some embodiments, the method 100 further comprises pressurizing an internal volume of the PVD chamber to a pressure of about 10 millitorr to about 20 millitorr during the second deposition process, at which pressure the deposited amorphous silicon layer advantageously has a higher tensile stress. For example, the amorphous silicon layer may have a tensile stress of about 0.05 GPa to about 0.3 GPa.

In some embodiments, the subsets of the plurality of first deposition processes may be based on a number or substrates processed, kilowatt-hours of use, or the like. For example, the subsets of the plurality of first deposition processes may comprise processing about 10 substrates to about 20 substrates. In some embodiments, the subsets of the plurality of first deposition processes comprises processing about 12 substrates to about 15 substrates. In some embodiments, the second deposition process is performed about every 20 kilowatt-hours to 60 kilowatt-hours. In some embodiments, the second thickness is greater than a combined thickness of the plurality of first deposition processes in each subset. In some embodiments, the second thickness is about 1 micrometer to about 4 micrometers. In some embodiments, the second deposition process is performed using argon as a process gas. In some embodiments, a shutter disk is placed on the substrate support during the second deposition process instead of the substrate. The plurality of first deposition processes and the second deposition process may be repeated until an end of life of the process kit.

Optionally, at 106, a third deposition process is performed on the process kit between a second subset of the plurality of first deposition processes to deposit an amorphous silicon layer having a third thickness greater than the second thickness. In some embodiments, the third thickness is about 3 to about 6 micrometers. In some embodiments, the second subset comprises about 900 to about 1500 substrates. In some embodiments, the second subset comprises about 1000 to about 1200 substrates. The third deposition process may be repeated for every second subset until an end of life of the process kit.

Figure 2:
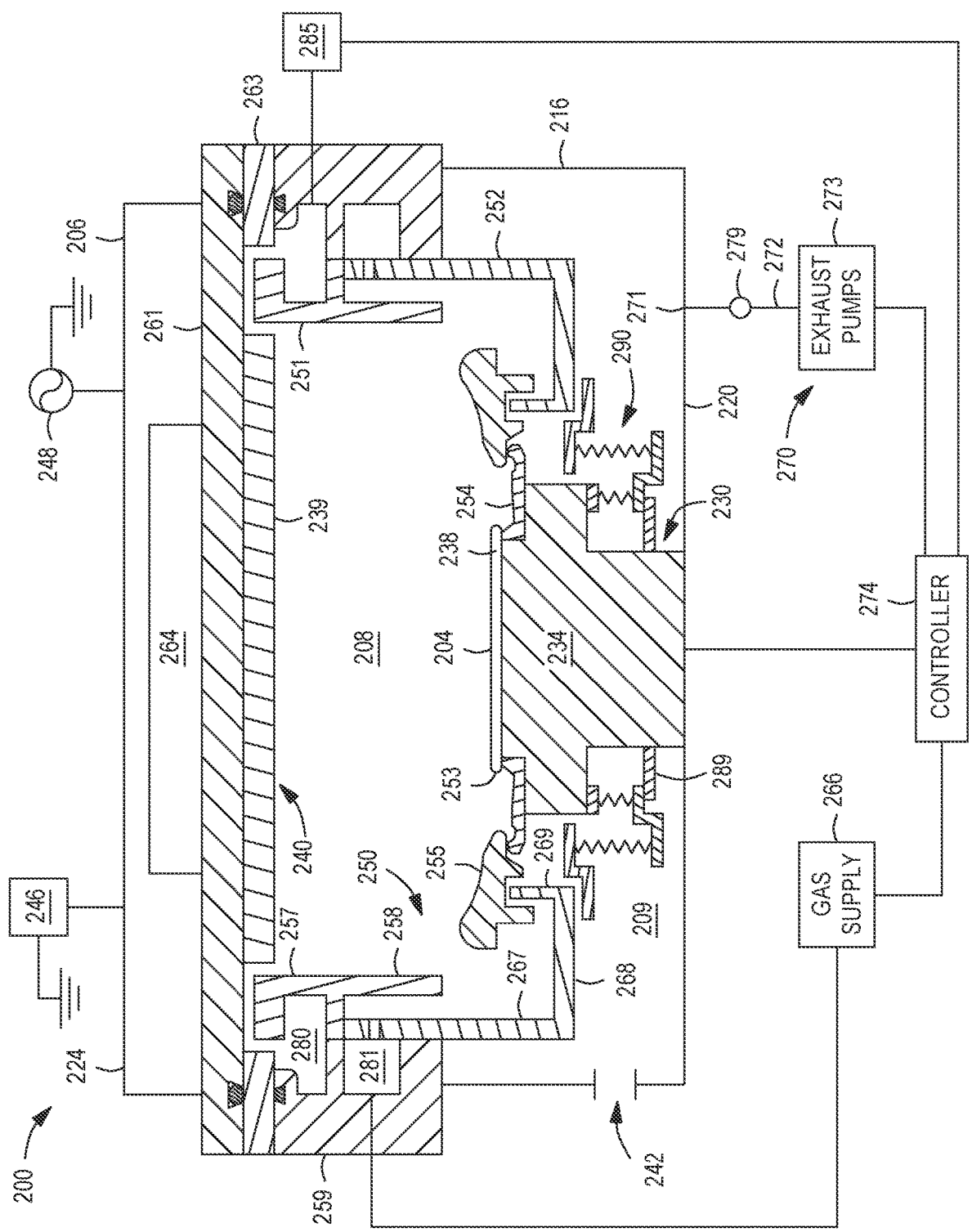
FIG. 2 depicts a schematic cross-sectional view of a PVD chamber in accordance with at least some embodiments of the present disclosure.

FIG. 2 depicts a schematic cross-sectional view of a PVD chamber (e.g., process chamber 200) in accordance with at least some embodiments of the present disclosure. However, other processing chambers may also benefit from the inventive apparatus disclosed herein. The process chamber 200 comprises chamber walls 206 that enclose an inner volume having a processing volume 208 and a non-processing volume 209. The chamber walls 206 include sidewalls 216, a bottom wall 220, and a ceiling 224. The ceiling 224 may include a chamber lid or a similar cover to seal off the inner volume. The process chamber 200 can be a standalone chamber or a part of a multi-chamber platform (not shown) having a cluster of interconnected chambers connected by a substrate transfer mechanism that transfers substrates 204 between the various chambers (e.g., a substrate transfer robot). The process chamber 200 may be a PVD chamber capable of sputter depositing material onto the substrate 204. Non-limiting examples of suitable materials for sputter deposition includes silicon nitride (SiN), silicon oxide ($SiO_2$), amorphous Si, silicon-carbon oxide (SiOC), silicon oxynitride (SiON)

The process chamber 200 comprises a substrate support 230 which comprises a pedestal 234 to support the substrate 204. The pedestal 234 has a substrate support surface 238 having a plane substantially parallel to a sputtering surface 239 of a sputtering target 240 disposed in an upper section of the process chamber 200. The substrate support surface 238 of the pedestal 234 receives and supports the substrate 204 during processing. The pedestal 234 may include an electrostatic chuck or a heater (such as an electrical resistance heater, heat exchanger, or other suitable heating device). In operation, a substrate 204 is introduced into the non-processing volume 209 of the process chamber 200 through a substrate loading inlet 242 in the sidewall 216 of the process chamber 200 and placed onto the substrate support 230, which is in a non-processing position during loading of the substrate 204. The substrate support 230 can be lifted or lowered by a support lift mechanism and a lift finger assembly can be used to lift and lower the substrate 204 onto the substrate support 230 during placement of the substrate 204 on the substrate support 230 by a robot arm. The pedestal 234 can be maintained at an electrically floating potential or grounded during plasma operation.

The process chamber 200 may include a sealing apparatus 290 coupled to the pedestal 234 via a base plate 289 that may be coupled to the substrate support 230. The sealing apparatus 190 is configured to fluidly isolate the processing volume 208 from the non-processing volume 209 during processing of the substrate 204 so that pumping down to a process pressure and process gas delivery only occurs in the processing volume 208. As a result, the time required to pump down and deliver gas to the processing volume 208 is reduced.

The process chamber 200 also contains a process kit 250, which comprises various components that can be easily removed from the process chamber 200, for example, to clean sputtering deposits off the component surfaces, replace or repair eroded components, or to adapt the process chamber 200 for other processes. The process kit 250 can be made of any suitable material such as aluminum, stainless steel, a ceramic material, or the like. A gas supply 266 is configured to supply one or more process gases to the processing volume 208 during processing. The gas supply 266 may be coupled to a gas supply channel 281 that facilitates supplying the one or more process gases to the processing volume 208. In addition, the process chamber 200 can include a pumping plenum 280 fluidly coupled to the processing volume 208. The pumping plenum no is coupled to a pump 285 to evacuate the processing volume 108.

In some embodiments, the process kit 250 includes an upper shield 251 and a lower shield 252. The upper shield has a diameter sized to encircle the sputtering surface 239 of the sputtering target 240 and the substrate support 230 (e.g., a diameter larger than the sputtering surface 239 and larger than the support surface of the substrate support 230). The upper shield may have an upper portion 257 disposed atop the lower shield 252 and a lower portion 258 that extends downward from the upper portion 257 and vertically overlaps at least a portion of the lower shield 252 in a spaced apart relation to a radially inner surface of the lower shield 252 (e.g., defining a gap between the lower portion 258 and the lower shield 252).

The lower shield 252 includes a cylindrical portion 267, a ledge 268 extending radially inward from a bottom portion of the cylindrical portion 267, and a lip 269 extending upward from a radially innermost portion of the ledge 268 and surrounding the substrate support 230, Although the upper shield 251 and the lower shield 252 are depicted as being separate elements, in some embodiments, the upper shield 251 and the lower shield 252 may be formed as one unitary structure. The upper shield 251 and the lower shield 252 may be formed of the same material or different materials such as, for example, an aluminum alloy, stainless steel, or a ceramic. In some embodiments, the upper portion 257 of the upper shield 251 and the upper portion of the cylindrical portion 267 interface with the annular adapter 259 to form the pumping plenum 180 and the gas supply channel 281, both of which are fluidly coupled to the processing volume 208. In some embodiments, an insulator ring 263 may be disposed between the annular adapter 259 and the backing plate 261 to electrically insulate the annular adapter 259 and chamber walls from the backing plate 261.

The process kit 250 may include a cover ring 255 disposed atop the lip 269 and a deposition ring 254 disposed below the cover ring 255. A bottom surface of the cover ring 255 interfaces with the deposition ring 254, The cover ring 255 at least partially covers the deposition ring 254. The deposition ring 254 and cover ring 255 cooperate with one another to reduce formation of sputter deposits on the peripheral walls of the substrate support 230 and an overhanging edge 253 of the substrate 204.

The process chamber 200 further comprises a sealing apparatus 190 coupled to the pedestal 134 to seal off the processing volume 108 from the non-processing volume 109 when the pedestal 134 is in a processing position. The sealing apparatus 190 is configured to selectively seal the processing volume 108 from the non-processing volume 109 when the pedestal 134 is in a processing position, while allowing the processing volume 108 and the non-processing volume 109 to be fluidly coupled when the pedestal 134 is in a non-processing position, for example, when in a lowered, loading position.

The sputtering target 240 is connected to one or both of a DC power source 246 and an RF power source 248. The DC power source 246 can apply a bias voltage to the sputtering target 240 relative to the upper shield 251, which may be electrically floating during a sputtering process. While the DC power source 246 supplies power to the sputtering target 240, the upper shield 251 the pedestal 234, and other chamber components connected to the DC power source 246, the RF power source 248 energizes the sputtering gas to form a plasma of the sputtering gas. The plasma formed impinges upon and bombards the sputtering surface 239 of the sputtering target 240 to sputter material off the sputtering surface 139 onto the substrate 204. In some embodiments, RF energy supplied by the RF power source 248 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 200 may include a magnetic field generator 264 disposed above the sputtering target 240 to shape a magnetic field about the sputtering target 240 to improve sputtering of the sputtering target 240. The capacitively generated plasma may be enhanced by a magnetic field generator 264 in which for example, a permanent magnet or electromagnetic coils may provide a magnetic field in the process chamber 200 that has a rotating magnetic field having a rotational axis that is perpendicular to the plane of the substrate 204. The process chamber 200 may, in addition or alternatively, comprise a magnetic field generator 264 that generates a magnetic field near the sputtering target 240 of the process chamber 200 to increase an ion density in a high-density plasma region adjacent to the sputtering target 240 to improve the sputtering of the target material. In some embodiments, the sputtering target 240 is coupled to a backing plate 246 that is disposed between the sputtering target 240 and the magnetic field generator 264.

In some embodiments, the process chamber 200 may additionally include an exhaust 270. The exhaust 270 comprises an exhaust port 271 that may receive some spent process gas and passes the spent gas to an exhaust conduit 272 having a throttle valve 279 to control a pressure of the gas in the process chamber 200. The exhaust conduit 272 is connected to one or more exhaust pumps 273.

Figure 3:
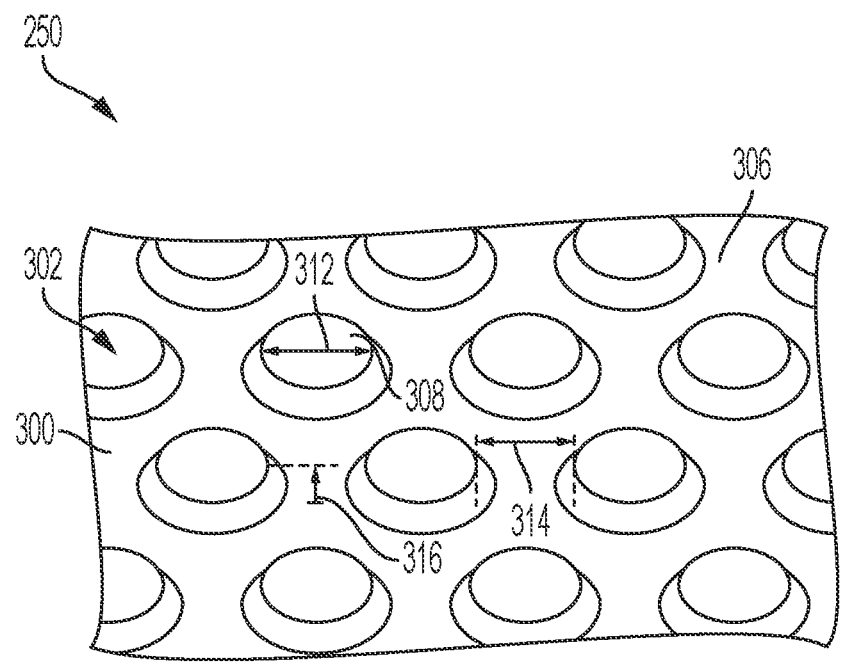
FIG. 3 depicts a close-up isometric view of a portion of a process kit in accordance with some embodiments of the present disclosure.

Various components of the process chamber 200 may be controlled by a controller 274. The controller 274 comprises program code having instruction sets to operate the components to perform the methods described herein. For example, the controller 274 can comprise program code that includes, but is not limited to, substrate positioning instruction sets to operate the pedestal 234 and substrate transfer mechanism; instructions to perform a second deposition process or a third deposition process based on a number of substrates processed, gas flow control instruction sets to operate gas flow control valves to set a flow of sputtering gas to the process chamber 200; gas pressure control instruction sets to operate the maintain a pressure in the process chamber 200; gas energizer control instruction sets to operate the RF power source 248 to set a gas energizing power level; temperature control instruction sets to control a temperature control system in the pedestal 234; and process monitoring instruction sets to monitor the process in the process chamber 200, FIG. 3 depicts a close-up isometric view of a portion of a process kit 150 in accordance with some embodiments of the present disclosure. An outer surface 300 of the process kit 150 is advantageously texturized to promote adhesion of deposited materials. For example, FIG. 3 depicts the outer surface 300 texturized via an additive manufacturing technique and comprising a plurality of protrusions 302 extending from the outer surface 300 and forming a plurality of valleys 306 therebetween. Additive manufacturing generally is a technique of manufacturing three dimensional components by laying down successive thin layers of material. The plurality of protrusions 302 may have an upper surface 308 having a diameter 312 of about 0.6 millimeters to about 1.4 millimeters. The plurality of protrusions 320 may be separated by a first distance 314. In some embodiments, the first distance 314 is about 0.5 millimeters to about 4.5 millimeters. In some embodiments, the first distance 314 may be measured from the upper surfaces of the respective protrusions of the plurality of protrusions 302. In some embodiments, the plurality of protrusions 302 have a height 316 from the outer surface 300 of the process kit 250 to the upper surface 308 of the plurality of protrusions 302 of about 0.2 millimeters to about 1.5 millimeters.

FIG. 4 depicts a schematic side view of a process kit in accordance with some embodiments of the present disclosure after a plurality of first deposition processes and a second deposition process. As shown in FIG. 4, the process kit 250 has a plurality of SiN layers 402, where each of the SiN layers (e.g., 402a, 402b . . . 402n) correspond with a first deposition process. In some embodiments, the plurality of SiN layers 402 comprise about 10 to about 20 layers. In some embodiments, a first thickness 406 of each SiN layer of the plurality of SiN layers 402 is the first thickness is about 100 nanometers to about 300 nanometers. An amorphous silicon layer 404 is disposed on the plurality of SiN layers 402. In some embodiments, the amorphous silicon layer 404 has a second thickness 410 of about 1 micrometer to about 4 micrometers.

Figure 5:
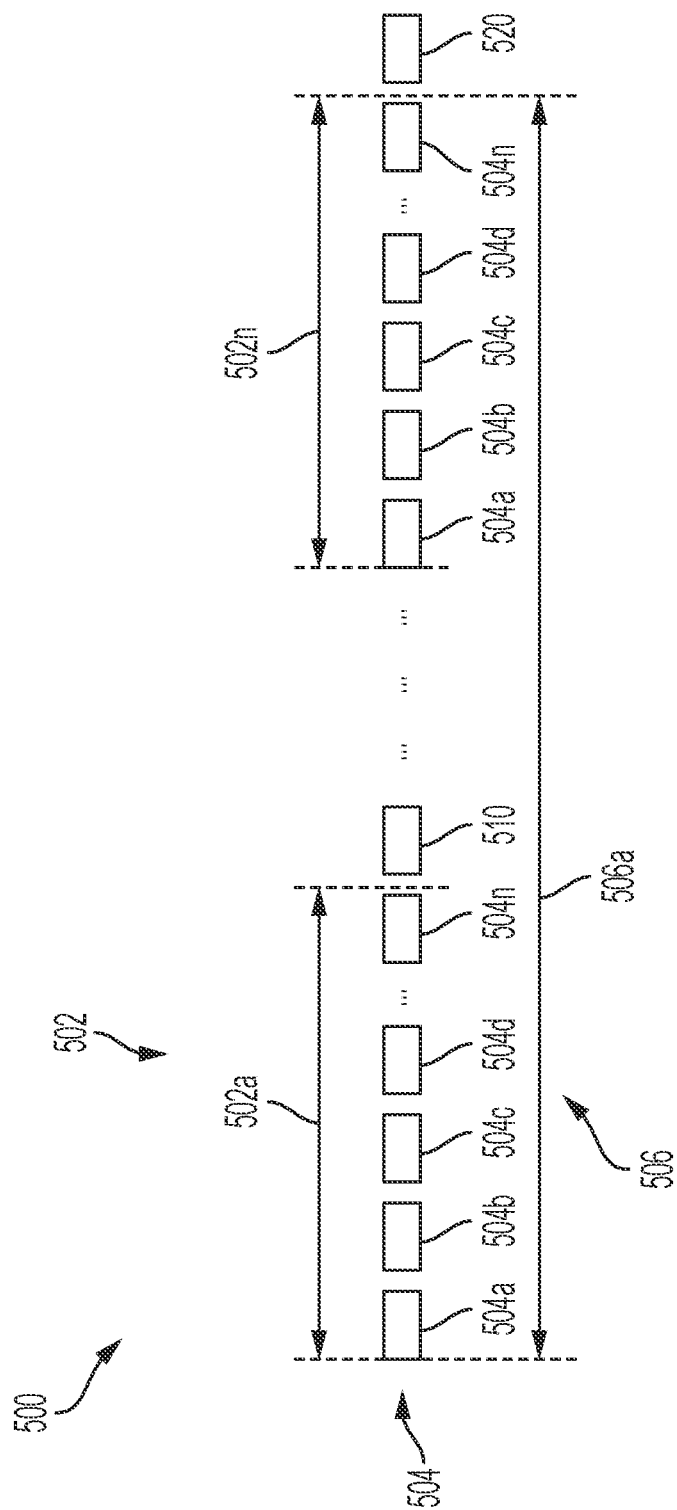
FIG. 5 depicts a block diagram of a plurality of deposition processes accordance with at least some embodiments of the present disclosure.

FIG. 5 depicts a block diagram a plurality of deposition processes 500 in accordance with some embodiments of the present disclosure. In some embodiments, the plurality of deposition processes 500 comprise a plurality of subsets 502 (e.g., subsets 502a thru 502n). Each of the plurality of subsets 502 comprise a plurality of first deposition processes 504 (e.g., first deposition processes 504a thru 504n) where a SiN layer is deposited onto the process kit 250. In some embodiments, the first deposition process 504n corresponds with a 10$^{th}$ to about 20$^{th}$ first deposition process in the respective subset of the plurality of subsets 502. After the first deposition process 504n of each subset, a second deposition process 510 comprising an amorphous silicon deposition is performed on the process kit 250.

In some embodiments, the plurality of deposition processes 500 comprise a plurality of second subsets 506 (only one shown in FIG. 5 for clarity). Each of the plurality of second subsets 506 comprise the plurality of first deposition processes 504 of the plurality of subsets. For example, the second subset 506a comprises the plurality of first deposition processes 504a thru 504n for subsets 502a thru 502n. A third deposition process 520 comprising an amorphous silicon deposition may be performed on the process kit 250 after each of the plurality of second subsets 506. In some embodiments, the third deposition process 520 may be performed after processing about 900 to about 1500 substrates. Accordingly, the second deposition process 510 and the third deposition process 520 may be repeated until an end of life of the process kit 250. In some embodiments, the end of life of the process kit 250 corresponds to processing about 2000 to about 4000 substrates.

While the foregoing is directed to embodiments of the present disclosure, other and further embodiments of the disclosure may be devised without departing from the basic scope thereof.

The invention claimed is:

1. A method of reducing particle formation in physical vapor deposition (PVD) chamber, comprising:
    performing a plurality of first deposition processes on a corresponding series of substrates disposed on a substrate support in the PVD chamber, wherein the PVD chamber includes a process kit disposed about the substrate support and having a texturized outer surface, and wherein a silicon nitride (SiN) layer having a first thickness is deposited onto the texturized outer surface during each of the plurality of first deposition processes; and
    performing a second deposition process on the process kit between subsets of the plurality of first deposition processes to deposit an amorphous silicon layer having a second thickness onto an underlying silicon nitride (SiN) layer.

2. The method of claim 1, wherein the subsets of the plurality of first deposition processes comprises processing about 10 substrates to about 20 substrates.

3. The method of claim 1, further comprising pressurizing an internal volume of the PVD chamber to a pressure of about 10 millitorr to about 20 millitorr during the second deposition process.

4. The method of claim 1, wherein the first thickness is about 100 nanometers to about 300 nanometers.

5. The method of claim 1, wherein the second thickness is about 1 micrometer to about 4 micrometers.

6. The method of claim 1, further comprising performing a third deposition process on the process kit between a second subset of the plurality of first deposition processes to deposit an amorphous silicon layer having a third thickness greater than the second thickness.

7. The method of claim 6, wherein the second subset comprises about 900 to about 1500 substrates.

8. The method of claim 1, wherein the silicon nitride (SiN) layer is a compressive stress layer and the amorphous silicon layer is a tensile stress layer.

9. The method of claim 1, wherein the second deposition process comprises using argon as a process gas.

10. The method of claim 1, wherein the plurality of first deposition processes comprises using a process gas comprising nitrogen and argon.

11. A method of reducing particle formation in a physical vapor deposition (PVD) chamber, comprising:
    performing a plurality of first deposition processes on a corresponding series of substrates disposed on a substrate support in the PVD chamber, wherein the PVD chamber includes a cover ring disposed about the substrate support and having a texturized outer surface, and wherein a silicon nitride (SiN) layer having a first thickness is deposited onto the texturized outer surface during each of the plurality of first deposition processes;

performing a second deposition process on the cover ring between subsets of the plurality of first deposition processes to deposit an amorphous silicon layer having a second thickness onto an underlying silicon nitride (SiN) layer, wherein the second thickness is greater than the first thickness; and performing a third deposition process on the cover ring between a second subset of the plurality of first deposition processes to deposit an amorphous silicon layer having a third thickness greater than the second thickness.

12. The method of claim 11, further comprising placing a shutter disk on the substrate support during the second deposition process.

13. The method of claim 11, wherein the texturized outer surface comprises a plurality of protrusions having a spacing between about 0.5 millimeters to about 4.5 millimeters.

14. The method of claim 11, wherein the texturized outer surface comprises a plurality of protrusions having a height of about 0.2 millimeters to about 1.5 millimeters.

15. The method of claim 11, wherein at least one of:
the first thickness is about 100 nanometers to about 300 nanometers,
the second thickness is about 1 micrometers to about 4 micrometers, or
the third thickness is about 3 to about 6 micrometers.

16. The method of claim 11, wherein the second deposition process is performed about every 20 kilowatt-hours to 60 kilowatt-hours, and wherein the third deposition process is performed about every 250 kilowatt-hours to 350 kilowatt-hours.

17. The method of claim 11, further comprising pressurizing an internal volume of the PVD chamber to a pressure of about 10 millitorr to about 20 millitorr during the second deposition process.

18. A method of reducing particle formation in a physical vapor deposition (PVD) chamber, comprising:
performing a first deposition process on a substrate disposed on a substrate support in the PVD chamber, wherein the PVD chamber includes a cover ring disposed about the substrate support and having a texturized outer surface, and wherein a silicon nitride (SiN) layer having a first thickness is deposited onto the texturized outer surface during the first deposition process;

repeating the first deposition process on about 10 to about 20 subsequent corresponding substrates in the PVD chamber; and performing a second deposition process on the cover ring in the PVD chamber to deposit an amorphous silicon layer having a second thickness onto an underlying silicon nitride (SiN) layer.

19. The method of claim 18, further comprising:
performing a third deposition process on the cover ring in the PVD chamber after performing the first deposition process on about 900 to about 1500 substrates to deposit an amorphous silicon layer having a third thickness.

20. The method of claim 19, wherein the second thickness is greater than the first thickness, and the third thickness is greater than the first thickness.

* * * * *